US006417728B1

United States Patent
Baschirotto et al.

(10) Patent No.: US 6,417,728 B1
(45) Date of Patent: Jul. 9, 2002

(54) SWITCHED-CAPACITOR, FULLY-DIFFERENTIAL OPERATIONAL AMPLIFIER WITH HIGH SWITCHING FREQUENCY

(75) Inventors: Andrea Baschirotto, Tortona; Paolo Cusinato, Sestri Levante, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/887,508

(22) Filed: Jun. 22, 2001

(30) Foreign Application Priority Data

Jun. 26, 2000 (EP) .......................................... 00830449

(51) Int. Cl.$^7$ ................................................. H03F 1/14
(52) U.S. Cl. .......................................... 330/9; 330/258
(58) Field of Search ............................ 330/9, 69, 253, 330/258, 260, 261

(56) References Cited

U.S. PATENT DOCUMENTS

| | | | |
|---|---|---|---|
| 5,057,788 A | * 10/1991 | Ushida et al. | 330/261 |
| 5,128,630 A | * 7/1992 | Mijuskovic | 330/253 |
| 5,221,909 A | * 6/1993 | Cole | 330/253 |
| 5,606,288 A | * 2/1997 | Prentice | 330/258 |
| 5,613,233 A | * 3/1997 | Vagher | 330/258 |
| 5,838,200 A | 11/1998 | Opris | 330/258 |
| 5,847,601 A | 12/1998 | Wang | 330/9 |
| 5,986,502 A | * 11/1999 | Nakamura | 330/258 |
| 6,140,872 A | * 10/2000 | McEldowney | 330/9 |

FOREIGN PATENT DOCUMENTS

| | | |
|---|---|---|
| EP | 0 495 460 A1 | 7/1992 |
| EP | 0 840 442 A1 | 5/1998 |

OTHER PUBLICATIONS

Pan, T.W. et al., "A Wide–Band CMOS Read Amplifier for Magnetic Data Storage Systems," *IEEE Journal of Solid–State Circuits*, 27(6):863–873, Jun. 1, 1992.

* cited by examiner

*Primary Examiner*—Robert Pascal
*Assistant Examiner*—Khanh Van Nguyen
(74) *Attorney, Agent, or Firm*—Lisa K. Jorgenson; Robert Iannucci; Seed IP Law Group PLLC

(57) ABSTRACT

Fully-differential, switched-capacitor circuit having a first and second input terminal, and including: an operational amplifier having a first and a second differential input, a first and a second output terminal and a bias control terminal; a feedback network, connected between the differential outputs and the input terminals, and having intermediate nodes connected to the differential inputs of the operational amplifier; and a control circuit, including a detection network and an error amplifier. The error amplifier has a first input receiving a desired common-mode voltage, and an output connected to the bias control terminal and supplying a control voltage. The detection network has a first and a second input connected directly, respectively, to the second input terminal of the operational amplifier, and an output connected to a second input of the error amplifier, and supplying a common-mode drive voltage.

20 Claims, 4 Drawing Sheets

SWITCHED-CAPACITOR, FULLY-DIFFERENTIAL OPERATIONAL AMPLIFIER WITH HIGH SWITCHING FREQUENCY

TECHNICAL FIELD

The present invention relates to a switched-capacitor, fully-differential operational amplifier circuit with high switching frequency.

BACKGROUND OF THE INVENTION

As is known, in the manufacture of many switched-capacitor circuits, it is advantageous to use operational amplifiers with fully differential topology, i.e., having two output terminals supplying differential voltages symmetrical to a common-mode voltage. In fact, operational amplifiers with fully differential topology allow the manufacture of high-performance integrated circuits, which are highly accurate and have reduced dimensions, in order, for example, to implement high-level active filters.

In addition, it is known that, to prevent distortions of the signals being processed, the fully differential operational amplifiers require circuits for accurately controlling the output common-mode voltage. These circuits normally comprise a detection network, which has inputs connected to the output terminals of the operational amplifier, and an error amplifier. The detection network includes a divider, usually of capacitive type, and supplies the error amplifier with a common-mode signal representative of the output common-mode voltage of the operational amplifier. The error amplifier compares the common-mode signal with a reference signal with predetermined value, and generates a control signal supplied to a control terminal of the operational amplifier, in order to modify the biasing of the operational amplifier, and bring the output common mode voltage to a desired value.

However, the control circuits that are conventionally used are disadvantageous, in that the presence of the output common-mode voltage detection network reduces the maximum switching frequency of the operational amplifier. In fact, the detection network constitutes an additional load of capacitive type, connected to the output terminals of the operational amplifier, the bandwidth whereof is thus limited.

In addition, the capacitances forming the detection network must be charged and discharged at each cycle of the timing signal, and therefore require a current which can distort the response of the operational amplifier.

On the other hand, use of detection networks based on resistive-type dividers is disadvantageous, because the gain of the operational amplifier would be reduced, and therefore the performance levels would be reduced still more significantly.

SUMMARY OF THE INVENTION

An embodiment of the present invention provides a switched-capacitor circuit free from the described disadvantages and allows, in particular, the output common-mode voltage to be controlled without limiting the maximum operating frequency.

According to an embodiment of the present invention, there is provided a fully-differential switched-capacitor, operational amplifier circuit that includes: a first and second input terminal; an operational amplifier; a first and a second feedback network; and a control circuit. The operational amplifier has a first and a second differential input, respectively receiving a first and a second differential drive voltage, symmetric to a common-mode drive voltage; a first and a second output terminal, respectively supplying a first and a second differential output voltage, symmetric to an output common-mode voltage; and a bias control terminal. The first and second feedback networks are arranged respectively between the first differential output and the first input terminals and between the second differential output and the second input terminals, and have respective intermediate nodes connected respectively to the first and second differential inputs of the operational amplifier. The control circuit has an output connected to the bias control terminal, detects the output common-mode voltage, and feeds the bias control terminal with a control signal correlated to the output common-mode voltage. In addition, the control circuit has a first and a second input that are connected directly, respectively, to the first and second differential inputs of the operational amplifier and that receive respectively the first and the second differential drive voltages.

BRIEF DESCRIPTION OF THE DRAWINGS

For a better understanding of the invention, an embodiment is now described, purely by way of non-limiting example, with reference to the attached drawings, wherein.

DETAILED DESCRIPTION OF THE INVENTION

Figure 1:
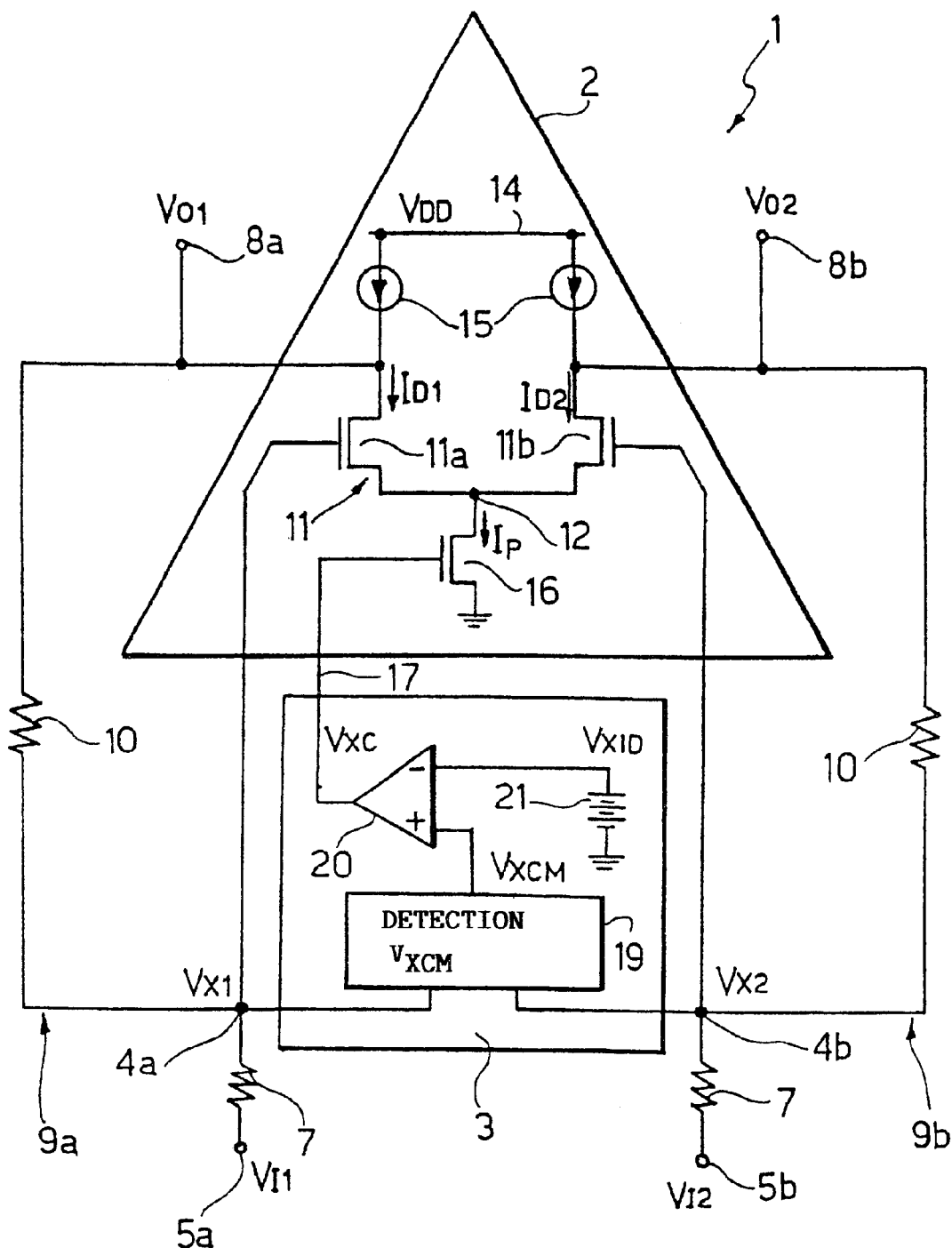
FIG. 1 illustrates a simplified circuit diagram of a switched-capacitor circuit according to a first embodiment of the present invention.

FIG. 1 shows a switched-capacitor circuit 1, of fully differential type, having an output common-mode control, comprising a single-stage operational amplifier 2 with fully differential topology, operating in a feedback configuration, and a common-mode control circuit 3.

The operational amplifier has a first and a second differential input 4a, 4b, connected respectively to a first and a second input terminal 5a, 5b of the switched-capacitor circuit 1, through respective input resistive elements 7, of a same resistance value, preferably formed using switched capacitors, in a per se known manner. The input terminals 5a, 5b receive first and second differential input voltages $V_{I1}$, $V_{I2}$ symmetric to an input common-mode voltage. This input common-mode voltage is kept at a predetermined value through a stabilized stage (of known type, and not shown) connected upstream of the switched capacitor circuit 1.

The operational amplifier 2 additionally has a first and a second differential output 8a, 8b, forming outputs of the switched-capacitor circuit 1, and supply respectively a first and a second differential output voltage $V_{O1}$, $V_{O2}$, symmetric to an output common-mode voltage $V_{OCM}$. Each of the differential outputs 8a, 8b is connected to a respective differential input 4a, 4b through a respective feedback resistive element 10. The feedback resistive elements 10 have a same resistance value, and are preferably formed by switched capacitors, in a known manner. The resistive input elements 7 and feedback elements 10 thus form a first and a second feedback network 9a, 9b, equal to each other, and are arranged respectively between the first differential output 8a and the first input terminal 5a, and between the second differential output 8b and the second input terminal 5b. In addition, the first and second feedback networks 9a, 9b have intermediate nodes connected respectively to the first and second differential inputs 4a, 4b of the operational amplifier 2.

The operational amplifier 2 comprises a differential stage 11, including a first and a second differential transistor 11b, 11b of NMOS type, equal to each other, and have source terminals connected to a common node 12, gate terminals connected respectively to the first and second differential inputs 4a, 4b, and drain terminals connected respectively to the first and second differential outputs 8a, 8b. The drain terminals of the differential transistors 11a, 11b are also connected to a supply line 14, and feed a supply voltage $V_{DD}$ through respective active loads 15, here represented schematically by current sources. A first and a second differential current $I_{D1}$, $I_{D2}$ flow respectively in the first and second differential transistors 11a, 11b.

A bias transistor 16, through which a bias current $I_P$ flows, has a drain terminal connected to the common node 12, a source terminal grounded, and a gate terminal defining a bias control terminal 17 of the operational amplifier 2.

The common-mode control circuit 3 comprises a detection network 19, an error amplifier 20 and a reference voltage source 21.

The detection network 19 has a first and a second input connected respectively to the first and the second input of the operational amplifier 2, and an output connected to a non-inverting terminal of the error amplifier 20 and supplying a common-mode drive voltage $V_{XCM}$. The common-mode drive voltage $V_{XCM}$ is correlated to a mean value between differential drive voltages $V_{X1}$, $V_{X2}$ present respectively at the first and second inputs 4a, 4b of the operational amplifier 2.

The error amplifier 20 has an inverting input connected to the reference voltage source 21 supplying a desired common-mode voltage $V_{XID}$ and has an output connected to the bias control terminal 17 of the operational amplifier 2; the output supplies a control voltage $V_{XC}$ dependent on the difference between the common-mode drive voltage $V_{XCM}$ and the desired common-mode voltage $V_{XID}$. In particular, the control voltage $V_{XC}$ is such that, when the common-mode drive voltage $V_{XCM}$ is equal to the desired common-mode voltage $V_{XID}$, the output common-mode voltage $V_{OCM}$ is equal to a predetermined value (and is preferably equal to $V_{DD}/2$).

The switched-capacitor circuit 1 operates as follows. The values of the input differential voltages $V_{11}$, $V_{12}$, and thus also of the input common-mode voltage, are set and kept stable by the stage, not shown, which is upstream of the switched-capacitor circuit 1. Consequently, when variation occurs in the differential output voltages $V_{O1}$, $V_{O2}$, such as to give rise to a variation in the output common-mode voltage $V_{OCM}$ of the operational amplifier 2 (for example an increase), the differential drive voltages $V_{X1}$, $V_{X2}$ present respectively at the first and second inputs 4a, 4b of the operational amplifier 2 are accordingly varied, owing to the resistive division between the resistive feedback elements 10 and input elements 7. This variation is detected by the detection network 19, which causes the common-mode voltage drive $V_{XCM}$ to correspondingly vary. Consequently, the control voltage $V_{XC}$ generated by the error amplifier 20, the bias current $I_P$ and the differential currents $I_{D1}$, $I_{D2}$, also vary in accordance with the output common-mode voltage $V_{OCM}$ (in the example, they increase). The differential output voltages $V_{O1}$, $V_{O2}$ therefore have variations with the opposite sign (in the example, they decrease), such as to counteract the variations in the output common-mode voltage $V_{OCM}$, in order to bring the latter to a desired value.

Figure 2:
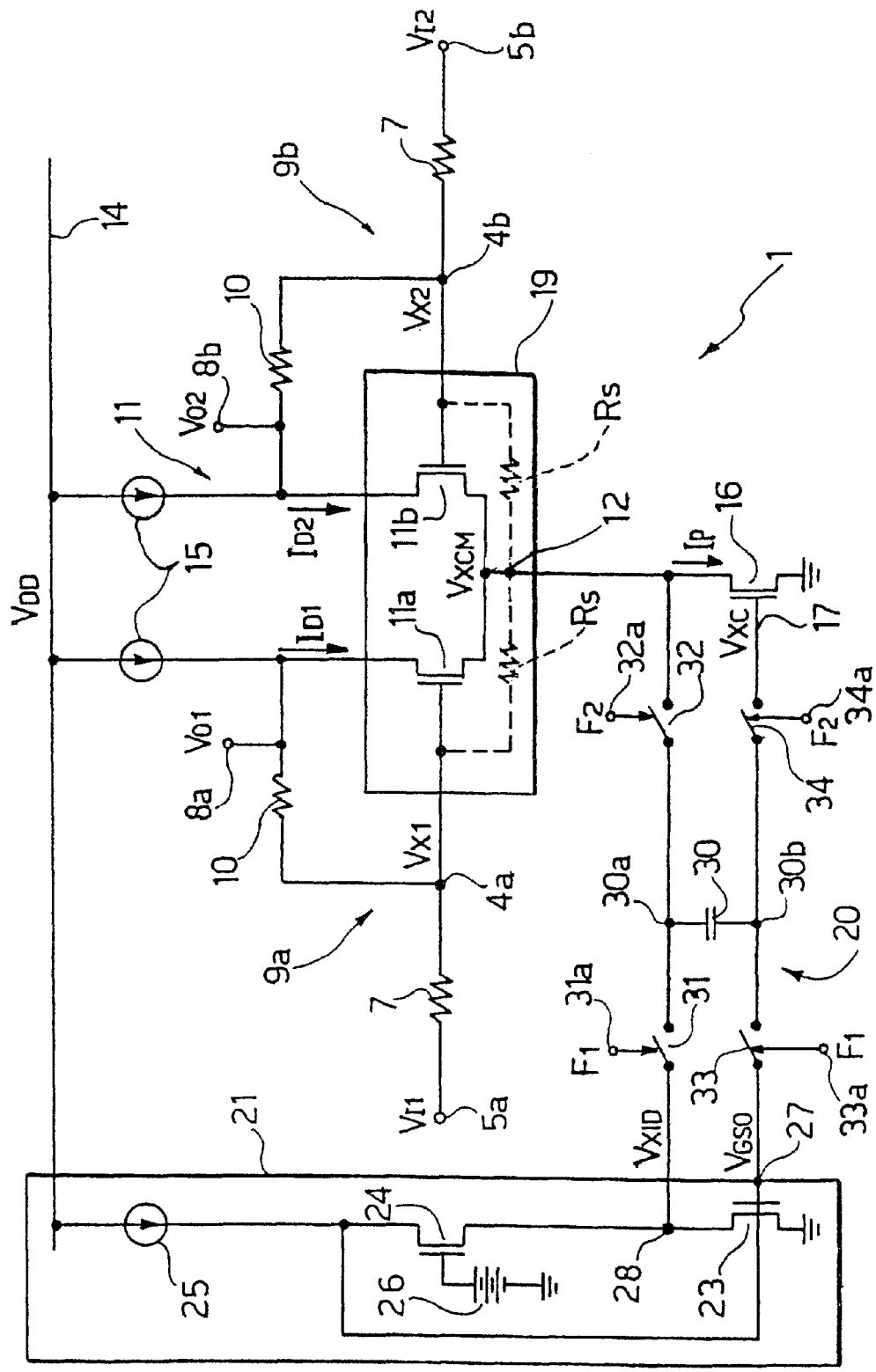
FIG. 2 illustrates a detailed circuit diagram of the circuit in FIG. 1.

FIG. 2, in which parts similar to those illustrated in FIG. 1 are indicated by the same reference numbers, shows a more detailed circuit diagram of the switched-capacitor circuit 1.

The detection network 19 advantageously comprises the same differential transistors 11a, 11b that form the differential stage 11. In particular, the gate terminals of the differential transistors 11a, 11b and the common node 12 form respectively inputs and an output of the detection network 19. In fact, the common node 12 is an intermediate node of a resistive divider arranged between the inputs 4a, 4b of the operational amplifier 2 and including equivalent source resistances $R_S$ (shown in broken lines in FIG. 2) of the differential transistors 11a, 11b, equal to each other.

The reference voltage source 21, preferably formed by a replica of a branch of the operational amplifier 2, comprises a first transistor 23, a second transistor 24, and an active load 25. The first transistor 23 has a grounded source terminal and gate and drain terminals connected respectively to the source and drain terminals of the second transistor 24, the gate terminal whereof is connected to a voltage source 26. In addition, the gate terminal of the first transistor 23 defines a first reference node 27, which supplies a desired gate-source voltage $V_{GSO}$; and the drain terminal of the first transistor 23 defines a second reference node 28, which supplies the desired common-mode voltage $V_{XID}$. The value of the desired gate-source voltage $V_{GSO}$ is equal to the value to be assumed by the control voltage $V_{XC}$ in absence of noise, to give the desired output common-mode voltage.

The active load 25 is connected between the supply line 14 and the drain terminal of the second transistor 24.

The error amplifier 20 comprises a switched capacitor 30 having a first terminal 30a connected alternatively to the second reference node 28, through a first switch 31, and to the common node 12, through a second switch 32; and a second terminal 30b connected alternatively to the first reference node 28, through a third switch 33, and to the bias terminal 17, through a fourth switch 34. Preferably, the switches 31–34 include respective MOS transistors. In addition, the first and third switches 31, 33 have respective control terminals 31a, 33a, which receive a first phase signal F1. The second and fourth switches 32, 34 have respective control terminals 32a, 34a, which receive a second phase signal F2.

The first and second phase signals F1, F2 are periodic, and, in push-pull manner and in successive half-periods, control opening and closure of the respective switches 31–34.

In particular, in a first half-period, the first phase signal F1 causes the first and third switches 31, 33 to close, whereas the second phase signal F2 causes the second and fourth switches 32, 34 to open. Consequently, the switched capacitor 30 is connected between the first and second reference nodes 27, 28 and is charged to a differential voltage of $V_{XID}-V_{GSO}$.

In a second half-period, the first phase signal F1 causes opening of the first and third switches 31, 33, whereas the second phase signal F2 causes closure of the second and fourth switches 32, 34.

The switched capacitor 30 is thus connected between the common node 12 and the bias control terminal 17, and, since it retains the charge previously accumulated, it acts as a battery, imposing the difference voltage $V_{XID}-V_{GSO}$ between the common node 12 and the bias control terminal 17. In practice, the switched capacitor 30 acts as a storage element, which, in the first half-period, reads and stores the difference voltage $V_{XID}-V_{GSO}$, and in the second half-period, transfers this voltage between the common node 12 and the bias terminal 17. Thereby, the control voltage $V_{XC}$ at the bias control terminal 17 is forced to follow the variations in the common-mode drive voltage $V_{XCM}$, thus giving rise to a similar variation in the gate-source voltage of the bias transistor 16, and therefore in the bias current $I_P$ and in the output common-mode voltage $V_{OCM}$, as previously illustrated.

In detail, if, for example, the output common-mode voltage $V_{OCM}$ increases, the differential drive voltages $V_{X1}$, $V_{X2}$ also increase, owing to the voltage division between the resistive feedback elements 10 and input elements 7, as already explained. The differential transistors 11a, 11b are in a source-follower configuration, and therefore, as is known to persons skilled in the art, the common-mode drive voltage $V_{XCM}$ increases substantially in the same manner as the differential drive voltages $V_{X1}$, $V_{X2}$.

Thus, the drive common-mode voltage $V_{XCM}$ is higher than the desired common-mode voltage $V_{XID}$, and the control voltage $V_{XC}$ increases. Consequently, the bias current $I_P$ and the differential currents $I_{D1}$, $I_{D2}$, which flow respectively in the bias transistor 16 and in the differential transistors 11a, 11b, also increase. Thus the differential output voltages $V_{O1}$, $V_{O2}$ decrease, thus counteracting the initial increase in the output common-mode voltage $V_{OCM}$.

Figure 3:
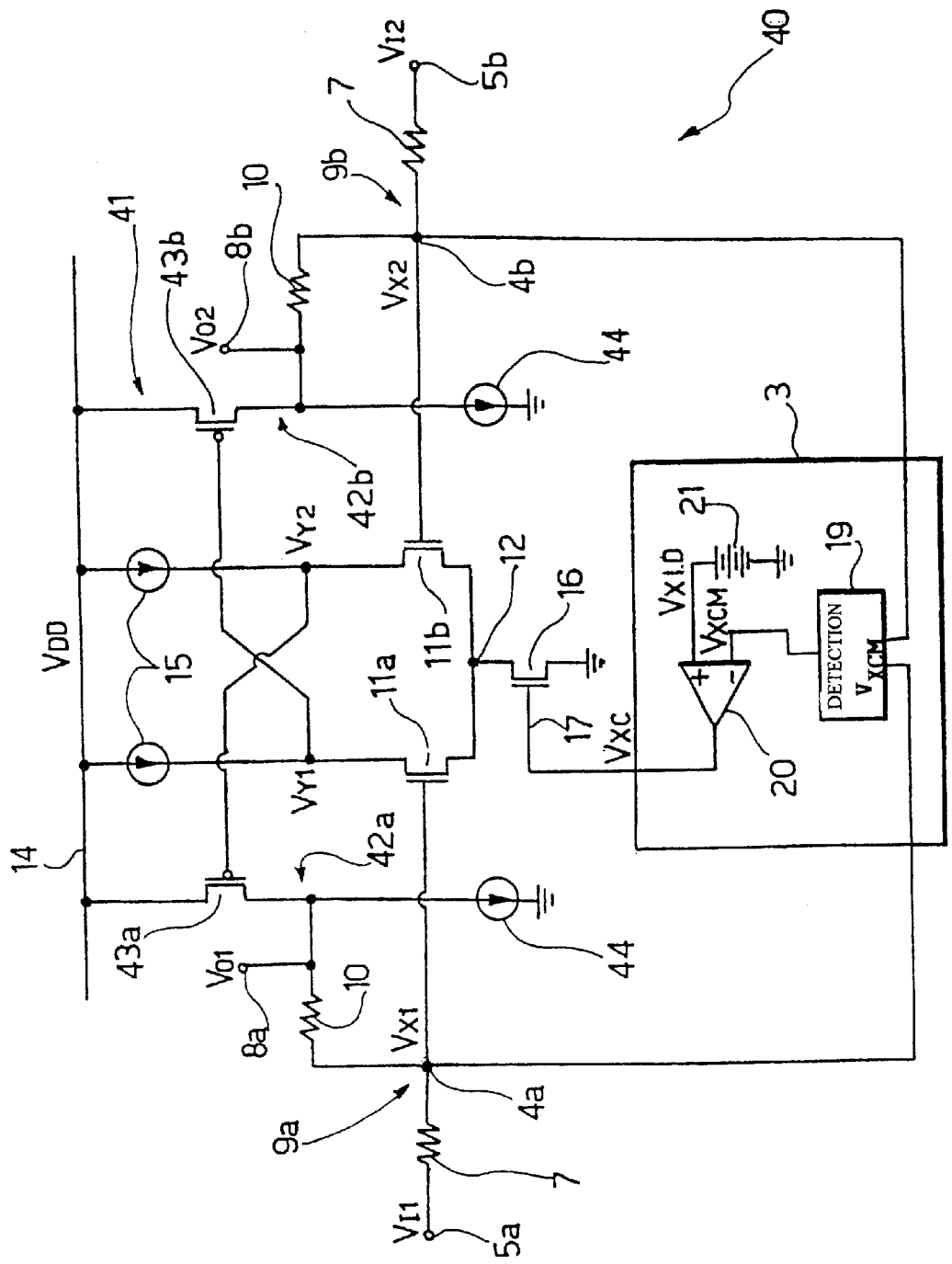
FIG. 3 shows a simplified circuit diagram of a switched-capacitor circuit, according to a second embodiment of the present invention.
Figure 4:
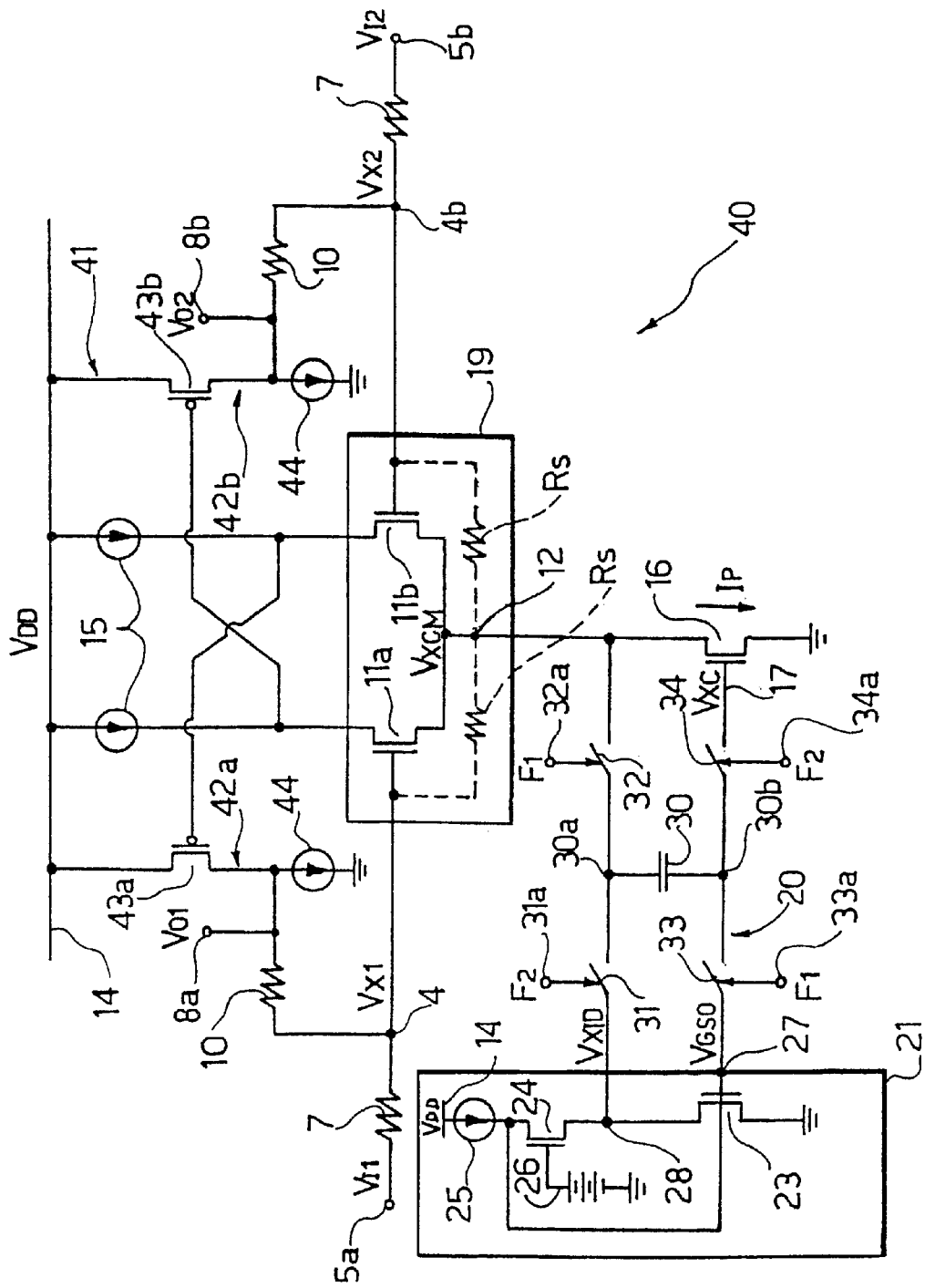
FIG. 4 illustrates a detailed circuit diagram of the circuit in FIG. 3.

FIGS. 3 and 4, in which parts similar to those already shown have the same reference numbers, illustrate a second embodiment of the present invention. According to this embodiment, a switched capacitor circuit 40 comprises a two-stage operational amplifier 41 with fully differential topology, and the common-mode control circuit 3. In particular, the common-mode control circuit 3 is the same as that shown in FIG. 1, except for the output of the detection network 19 is connected to the inverting input of the error amplifier 20, whereas the non-inverting input of the error amplifier 20 is connected to the reference voltage source 21.

As in the previous case, the operational amplifier 41 has the first and second inputs 4a, 4b connected respectively to the first and second input terminals 5a, 5b of the switched capacitor circuit 1 through the resistive input elements 7; and the first and second differential outputs 8a, 8b are connected respectively to the first and second inputs 4a, 4b through the resistive elements 10.

The operational amplifier 41 comprises the differential stage 11, the bias transistor 16, and a first and second output branch 42a, 42b.

The first output branch 42a comprises a first output transistor 43a of PMOS type, which has a source terminal connected to the supply line 14, a gate terminal connected to the drain terminal of the second differential transistor 11b (supplying a first intermediate voltage $V_{Y1}$), and a drain terminal connected to the first differential output 8a.

The second output branch 42b comprises a second output transistor 43b of PMOS type, which has a source terminal connected to the supply line 14, a gate terminal connected to the drain terminal of the first differential transistor 11a (supplying a second intermediate voltage $V_{Y2}$), and a drain terminal connected to the second differential output 8b.

In addition, the drain terminals of the first and second output transistors 43a, 43b are connected to ground through respective active loads, here shown through current sources 44.

As already explained with reference to FIG. 1, when the output common mode voltage $V_{OCM}$ varies, the differential drive voltages $V_{X1}$, $V_{X2}$ and the input common mode voltage $V_{XCM}$ vary accordingly. In this case, however, the control voltage $V_{XC}$ varies in the opposite way, since the input common-mode voltage $V_{XCM}$ is supplied to the inverting input of the error amplifier 20 (instead to the non-inverting input). This is necessary since, contrary to a single-stage operational amplifier, two inversions are present in the path between the inputs and outputs of a two-stage operational amplifier.

In the circuit in FIG. 4, which will be described only as to the differences with the circuit in FIG. 2, the second and third switches 32, 33 receive the first phase signal F1 at their respective control terminals 32a, 33a; and the first and fourth switches 31, 34 receive the second phase signal F2 at their respective control terminals 31a, 34a.

Consequently, in the first half-period, the first phase signal F1 causes the second and third switches 32, 33 to close, whereas the first and fourth switches 31, 34 are open. Thereby, the switched capacitor 30 is connected between the common node 12 and the first reference node 27, and is charged with a difference voltage of $V_{XCM} - V_{GSO}$.

In the second half-period, the second phase signal F2 controls the first and fourth switches 31, 34 to close, whereas the second and third switches 32, 33 are open. Thereby, the switched capacitor 30 is connected between the second reference node 28 and the bias control terminal 17, and, by acting as a battery, forces the bias control terminal 17 to the voltage $V_{XID}-(V_{XCM}-V_{GSO})$. Thereby, the control voltage $V_{XC}$ is determined by the difference voltage $V_{XCM}-V_{GSO}$ present at the switched capacitor 30. In particular, when the output common-mode voltage $V_{OCM}$ increases, thus causing the drive common-mode voltage $V_{XCM}$ to increase, the difference voltage $V_{XCM}-V_{GSO}$ increases, and the control voltage $V_{XC}$ decreases, and becomes lower than the desired gate-source voltage $V_{GSO}$. If, on the other hand, the output common-mode voltage $V_{OCM}$ decreases, the difference voltage $V_{XCM}-V_{GSO}$ decreases, and the control voltage $V_{XC}$ increases, and exceeds the desired gate-source voltage $V_{GSO}$. The variations in the control voltage $V_{XC}$ modify the intermediate voltages and the differential output voltages, as previously described, in order to eliminate the variations in the output common-mode voltage $V_{OCM}$.

In practice, the switched-capacitor circuit described detects the variations in the output common-mode voltage $V_{OCM}$ at the differential inputs 4a, 4b, instead of at the differential outputs 8a, 8b. Consequently, the output common-mode voltage $V_{OCM}$ is controlled without connecting additional capacitive loads to the outputs. Thus the frequency response characteristics of the operational amplifier 2, 41 are efficiently exploited, without limiting the operating frequency. The switched-capacitor circuits 1, 40 are thus particularly suitable for being used in high-frequency applications, when a substantial bandwidth is needed.

Secondly, the solution described requires a reduced number of components, since some parts of the common-mode control circuit 3 are formed by elements already included in the operational amplifier (this is the case, for example, of the detection network 19 and the reference voltage source 25).

Finally, it is apparent that modifications and variants can be made to the circuit described, without departing from the scope of the present invention.

In particular, it is possible to use operational amplifiers with different architecture. In addition, it is possible to manufacture circuits based on the double-sampling technique, such as to utilize the operational amplifier in both the half-periods of each timing cycle. For this purpose, it is necessary to use two error amplifiers acting in a push-pull manner. In this case, the phase signals must be distributed to the switches such that, while the switched capacitor of a first error amplifier is storing the difference voltage, in the same half-period the switched capacitor of the second error amplifier sets the control voltage $V_{XC}$. On the other hand, in the second half-period, the first error amplifier applies the difference voltage stored, whereas the second error amplifier stores it once more.

We claim:

1. A fully-differential, switched-capacitor, operational amplifier circuit, comprising:

a first and second input terminal;

an operational amplifier having a first and a second differential input, respectively receiving a first and a second differential drive voltage, symmetric to a common-mode drive voltage, a first and a second differential output, respectively supplying a first and a second differential output voltage, symmetric to an output common-mode voltage, and a bias control terminal;

a first and a second feedback network, arranged respectively between said first differential output and said first input terminal, and between said second differential output and said second input terminal, and having respective intermediate nodes connected respectively to said first and second differential inputs of said operational amplifier; and a control circuit having an output connected to said bias control terminal, said control circuit detecting said output common-mode voltage, and feeding said bias control terminal with a control signal correlated to said output common-mode voltage; wherein said control circuit has a first and a second input connected directly, respectively, to said first and second differential inputs of said operational amplifier and receiving respectively said first and said second differential drive voltages.

2. A circuit according to claim 1, wherein said operational amplifier comprises a detection network, and said control circuit comprises error amplifier means, said detection network having a first and a second input connected respectively to said first and second differential inputs of said operational amplifier, and an output, connected to a first input of said error amplifier means, and supplying an electrical quantity correlated to said drive common-mode voltage; said error amplifier means having a second input receiving a desired common-mode voltage and an output connected to said bias control terminal.

3. A circuit according to claim 2, wherein said detection network comprises a first and a second differential transistor having first conduction terminals connected together and to a common node, and control terminals connected respectively to said first and second differential inputs of said operational amplifier.

4. A circuit according to claim 3, wherein said first and second differential transistors form a differential stage of said operational amplifier.

5. A circuit according to claim 3 wherein said operational amplifier comprises a bias transistor having a control terminal connected to said bias control terminal, a first conduction terminal connected to said common node, and a second conduction terminal connected to a reference potential line.

6. A circuit according to claim 2 wherein said control circuit additionally comprises reference voltage source means supplying said desired common-mode voltage, and said error amplifier means comprise a storage element connected alternatively to said reference voltage source means and to said bias control terminal so as to store and subsequently transfer to said bias terminal a difference voltage correlated to said desired common-mode voltage.

7. A circuit according to claim 6, wherein said reference voltage source means comprise a first reference node supplying a desired control voltage for said bias terminal, and a second reference node supplying the desired common-mode voltage.

8. A circuit according to claim 7, wherein said first and second inputs of said error amplifier means are respectively a non-inverting input and an inverting input.

9. A circuit according to claim 8, wherein said storage element comprises a switched capacitor having a first terminal connected alternately to said second reference node and to said common node, respectively in a first and second operating phase; and a second terminal connected alternately to said first reference node and to said bias control terminal, respectively in said first and second operating phases.

10. A circuit according to claim 9, further comprising:

first switch means connected between said first terminal of said switched capacitor, and said second reference node;

second switch means connected between said first terminal of said switched capacitor and said common node;

third switch means connected between said second terminal of said switched capacitor and said first reference node;

fourth switch means connected between said second terminal of said switched capacitor and said bias control terminal; said first and second switch means having respective control terminals, and receiving a first phase signal; said third and fourth switch means having respective control terminals, and receiving a second phase signal in counterphase to said first phase signal.

11. A circuit according to claim 7, wherein said first and second inputs of said error amplifier means are respectively an inverting input and a non-inverting input.

12. A circuit according to claim 7 wherein said storage element comprises a switched capacitor having a first terminal alternately connected to said second reference node and to said common node, respectively in a first and a second operating phase; and a second terminal alternately connected to said first reference node and to said bias control terminal, respectively in said second and first operating phases.

13. A circuit according to claim 12, wherein said error amplifier means include:

first switch means connected between said first terminal of said switched capacitor and said reference node;

second switch means connected between said first terminal of said switched capacitor and said common node;

third switch means connected between said second terminal of said switched capacitor and said first reference node; and fourth switch means connected between said second terminal of said switched capacitor and said bias control terminal; said second and third switch means having respective control terminals receiving a first phase signal; said first and fourth switch means having respective control terminals receiving a second phase signal in counterphase to said first phase signal.

14. A circuit according to claim 12 wherein said operational amplifier is a two-stage operational amplifier.

15. A method for controlling a fully-differential, switched-capacitor, operational amplifier having a first and a second differential input receiving respectively a first and a second differential drive voltage symmetric to a drive common-mode voltage, a first and a second output terminal, supplying respectively a first and a second differential output voltage symmetric to an output common-mode voltage, and a bias control terminal; comprising the steps of:

connecting said first differential output to said first input terminal through a first feedback network, and connecting said second differential output to said second input terminal through a second feedback network;

detecting said output common-mode voltage, and feeding said bias control terminal with a control signal correlated to said output common-mode voltage, thereby keeping said output common-mode voltage at a desired common-mode voltage;

wherein said step of detecting comprises the step of detecting said first and second differential drive voltages at said first and second differential inputs of said operational amplifier, and in that said control signal is correlated to said common-mode drive voltage.

16. A fully-differential operational amplifier circuit, comprising:

first and second input terminals;

an operational amplifier having first and second differential inputs, first and second differential outputs, a bias control terminal, and a differential stage with a common node;

first and second feedback networks connected respectively between the first differential output and the first input terminal, and between the second differential output and the second input terminal, and having first and second intermediate nodes connected respectively to the first and second differential inputs of the operational amplifier; and an error amplifier having a first input coupled to the common node of the differential stage, a second input coupled to a first reference voltage, and an output coupled to the bias control terminal.

17. The circuit of claim 16 wherein the error amplifier includes a storage element, a first switch connecting the storage element to the first reference voltage during a charge storing phase, and a second switch connecting the storage element to the bias control terminal during a charge delivery phase.

18. The circuit of claim 16 wherein the operational amplifier includes a bias transistor connected between the common node and a second reference voltage, the bias transistor having a control terminal coincident with the bias control terminal.

19. The circuit of claim 18 wherein the error amplifier includes:

a first switch connected between a first terminal of the storage element and a third reference voltage;

a second switch connected between the first terminal of the storage element and the common node;

a third switch connected between a second terminal of the storage element and the first reference voltage; and a fourth switch connected between the second terminal of the storage element and the bias control terminal.

20. The circuit of claim 19 wherein the second and third switches have respective control terminals coupled to a first control signal and the first and fourth switches have respective control terminals coupled to a second control signal that is in counterphase to the first control signal.

* * * * *